United States Patent
Park et al.

(10) Patent No.: US 9,633,966 B2
(45) Date of Patent: Apr. 25, 2017

(54) STACKED SEMICONDUCTOR PACKAGE AND MANUFACTURING METHOD THEREOF

(71) Applicant: Amkor Technology, Inc., Tempe, AZ (US)

(72) Inventors: Dong Joo Park, Incheon (KR); Jae Sung Park, Paju-si (KR); Jin Seong Kim, Goyang-si (KR); Ju Hoon Yoon, Namyangju-si (KR)

(73) Assignee: AMKOR TECHNOLOGY, INC., Tempe, AZ (US)

( * ) Notice: Subject to any disclaimer, the term of this patent is extended or adjusted under 35 U.S.C. 154(b) by 0 days.

(21) Appl. No.: 14/877,373

(22) Filed: Oct. 7, 2015

(65) Prior Publication Data

US 2016/0104659 A1 Apr. 14, 2016

(30) Foreign Application Priority Data

Oct. 8, 2014 (KR) ......................... 10-2014-0135819

(51) Int. Cl.
*H01L 23/00* (2006.01)
*H01L 23/31* (2006.01)
(Continued)

(52) U.S. Cl.
CPC .......... *H01L 24/32* (2013.01); *H01L 23/3128* (2013.01); *H01L 23/49838* (2013.01); *H01L 24/29* (2013.01); *H01L 24/92* (2013.01); *H01L 25/105* (2013.01); *H01L 24/13* (2013.01); *H01L 24/16* (2013.01); *H01L 24/27* (2013.01); *H01L 24/73* (2013.01); *H01L 24/81* (2013.01);
(Continued)

(58) Field of Classification Search
CPC . H01L 2924/00014; H01L 2224/73203; H01L 23/49811; H01L 21/563; H01L 24/83; H01L 2224/81191; H01L 23/3142; H01L 2924/0002; H01L 24/73; H01L 2224/8385; H01L 2924/0665; H01L 23/295; H01L 2224/13099; H01L 2224/11; H01L 2224/16225; H01L 2224/73204; H01L 2224/32225; H01L 2224/32145; H01L 2224/0558; H01L 2224/1308; H01L 25/0657; H01L 2224/48145; H01L 25/16; H01L 2924/1627; H01L 25/03; H01L 2924/181; H01L 2224/16145; H01L 23/49575; H01L 2224/8388; H01L 2224/04105; H01L 2224/12105; H01L 2924/078; H01L 2924/00; C08K 5/005
See application file for complete search history.

(56) References Cited

U.S. PATENT DOCUMENTS

2015/0061095 A1* 3/2015 Choi ................. H01L 24/20
257/675

FOREIGN PATENT DOCUMENTS

| KR | 20070000186 A | 1/2007 |
|---|---|---|
| KR | 20090091484 A | 8/2009 |
| KR | 2016008652352 | 10/2014 |

* cited by examiner

*Primary Examiner* — Jasmine Clark
(74) *Attorney, Agent, or Firm* — McAndrews, Held & Malloy, Ltd.

(57) ABSTRACT

A stacked semiconductor package and a manufacturing method thereof. For example and without limitation, various aspects of this disclosure provide a semiconductor package in which an upper interposer and/or package are electrically and mechanically coupled to a lower package utilizing an adhesive member comprising conductive particles.

20 Claims, 5 Drawing Sheets

(51) Int. Cl.
  *H01L 23/48* (2006.01)
  *H01L 23/498* (2006.01)
  *H01L 25/065* (2006.01)
  *H01L 25/10* (2006.01)
  *H01L 25/00* (2006.01)

(52) U.S. Cl.
  CPC .............. *H01L 24/83* (2013.01); *H01L 25/50* (2013.01); *H01L 2224/131* (2013.01); *H01L 2224/16145* (2013.01); *H01L 2224/16146* (2013.01); *H01L 2224/16227* (2013.01); *H01L 2224/27436* (2013.01); *H01L 2224/294* (2013.01); *H01L 2224/29006* (2013.01); *H01L 2224/2939* (2013.01); *H01L 2224/29294* (2013.01); *H01L 2224/29344* (2013.01); *H01L 2224/29386* (2013.01); *H01L 2224/29393* (2013.01); *H01L 2224/32058* (2013.01); *H01L 2224/32145* (2013.01); *H01L 2224/32225* (2013.01); *H01L 2224/73204* (2013.01); *H01L 2224/73253* (2013.01); *H01L 2224/81447* (2013.01); *H01L 2224/81815* (2013.01); *H01L 2224/83101* (2013.01); *H01L 2224/83191* (2013.01); *H01L 2224/83192* (2013.01); *H01L 2224/83203* (2013.01); *H01L 2224/83385* (2013.01); *H01L 2224/83851* (2013.01); *H01L 2224/92* (2013.01); *H01L 2224/92125* (2013.01); *H01L 2224/92225* (2013.01); *H01L 2225/107* (2013.01); *H01L 2225/1023* (2013.01); *H01L 2225/1041* (2013.01); *H01L 2225/1058* (2013.01); *H01L 2225/1094* (2013.01); *H01L 2924/15311* (2013.01); *H01L 2924/15313* (2013.01); *H01L 2924/15331* (2013.01); *H01L 2924/18161* (2013.01); *H01L 2924/3511* (2013.01)

STACKED SEMICONDUCTOR PACKAGE AND MANUFACTURING METHOD THEREOF

CROSS-REFERENCE TO RELATED APPLICATIONS/INCORPORATION BY REFERENCE

The present application makes reference to, claims priority to, and claims the benefit of Korean Patent Application No. 10-2014-0135819, filed on Oct. 8, 2014 in the Korean Intellectual Property Office and titled "STACKED SEMICONDUCTOR DEVICE AND METHOD OF MANUFACTURING THE SAME," the contents of which are hereby incorporated herein by reference in their entirety.

FEDERALLY SPONSORED RESEARCH OR DEVELOPMENT

[Not Applicable]

SEQUENCE LISTING

[Not Applicable]

MICROFICHE/COPYRIGHT REFERENCE

[Not Applicable]

BACKGROUND

Present methods for forming various semiconductor devices, for example stacked semiconductor packages comprising an upper interposer and/or upper package stacked on a lower package, are inadequate, for example unnecessarily expensive and/or resulting in a semiconductor package having dimensions that are too large. Further limitations and disadvantages of conventional and traditional approaches will become apparent to one of skill in the art, through comparison of such approaches with the present disclosure as set forth in the remainder of the present application with reference to the drawings.

SUMMARY

Figure 1:
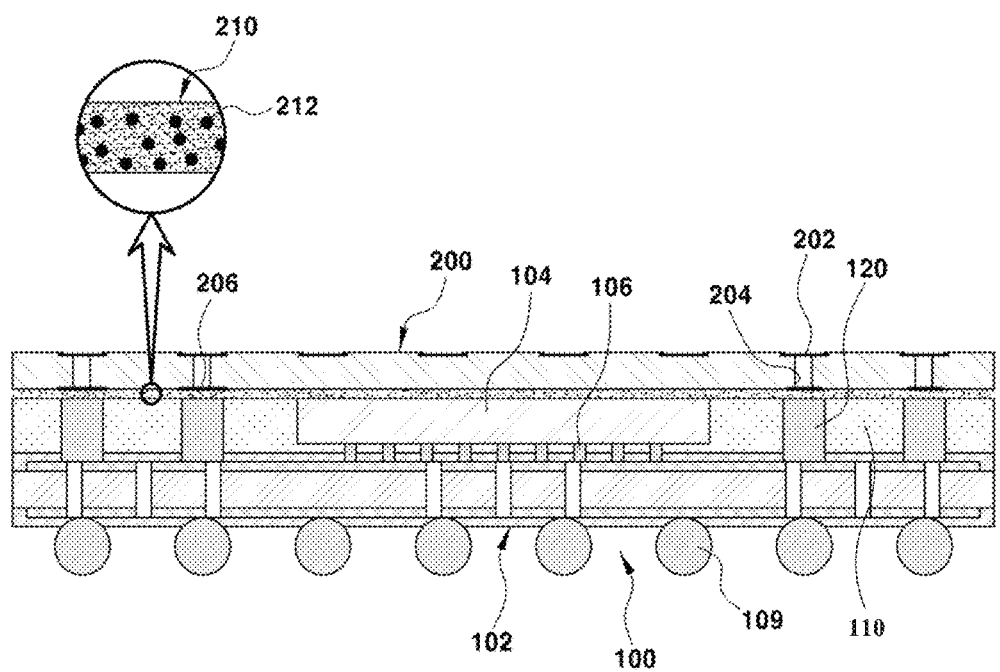
FIG. 1 shows a cross-sectional view of a stacked semiconductor package, in accordance with various aspects of the present disclosure.

Various aspects of this disclosure provide a stacked semiconductor package and a method for manufacturing thereof.

For example and without limitation, various aspects of this disclosure provide a semiconductor package in which an upper interposer and/or package are electrically and mechanically coupled to a lower package utilizing an adhesive member comprising conductive particles.

DETAILED DESCRIPTION OF VARIOUS ASPECTS OF THE DISCLOSURE

The following discussion presents various aspects of the present disclosure by providing examples thereof. Such examples are non-limiting, and thus the scope of various aspects of the present disclosure should not necessarily be limited by any particular characteristics of the provided examples. In the following discussion, the phrases "for example," "e.g.," and "exemplary" are non-limiting and are generally synonymous with "by way of example and not limitation," "for example and not limitation," and the like.

As utilized herein, "and/or" means any one or more of the items in the list joined by "and/or". As an example, "x and/or y" means any element of the three-element set $\{(x), (y), (x, y)\}$. In other words, "x and/or y" means "one or both of x and y." As another example, "x, y, and/or z" means any element of the seven-element set $\{(x), (y), (z), (x, y), (x, z), (y, z), (x, y, z)\}$. In other words, "x, y and/or z" means "one or more of x, y, and z."

The terminology used herein is for the purpose of describing particular examples only and is not intended to be limiting of the disclosure. As used herein, the singular forms are intended to include the plural forms as well, unless the context clearly indicates otherwise. It will be further understood that the terms "comprises," "includes," "comprising," "including," "has," "have," "having," and the like when used in this specification, specify the presence of stated features, integers, steps, operations, elements, and/or components, but do not preclude the presence or addition of one or more other features, integers, steps, operations, elements, components, and/or groups thereof.

It will be understood that, although the terms first, second, etc. may be used herein to describe various elements, these elements should not be limited by these terms. These terms are only used to distinguish one element from another element. Thus, for example, a first element, a first component or a first section discussed below could be termed a second element, a second component or a second section without departing from the teachings of the present disclosure. Similarly, various spatial terms, such as "upper," "lower," "side," and the like, may be used in distinguishing one element from another element in a relative manner. It should be understood, however, that components may be oriented in different manners, for example a semiconductor device may be turned sideways so that its "top" surface is facing horizontally and its "side" surface is facing vertically, without departing from the teachings of the present disclosure. Additionally, the term "on" will be utilized in the document to mean both "on" and "directly on" (e.g., with no intervening layer).

In the drawings, various dimensions (e.g., layer thickness, width, etc.) may be exaggerated for illustrative clarity. Additionally, like reference numbers are utilized to refer to like elements throughout the discussions of various examples.

Various aspects of the present disclosure provide a stacked semiconductor package manufacturing method thereof. For example, various aspects of the present disclosure provide a stacked semiconductor package and a manufacturing method thereof, wherein the size of a bond line between a lower semiconductor package and an interposer (or substrate of an upper semiconductor package) and the bondability therebetween may be increased using an adhesive member comprising conductive particles.

With the trend of decreasing the weight and size of various electronic devices and increasing the speed, functionality and performance thereof, semiconductor elements mounted in the electronic devices are required to exhibit high reliability. Accordingly, there have been developed a variety of semiconductor packages, including a wafer-level chip scale package; a chip-stacked package, configured such that chips attached to an interposer are mounted on a substrate; a package-on-package (POP), configured such that packages are stacked on the top and the bottom of an interposer; etc. An example package is shown at FIG. 5, which shows a cross sectional view of a stacked semiconductor package, in accordance with various aspects of the present disclosure.

Figure 5:
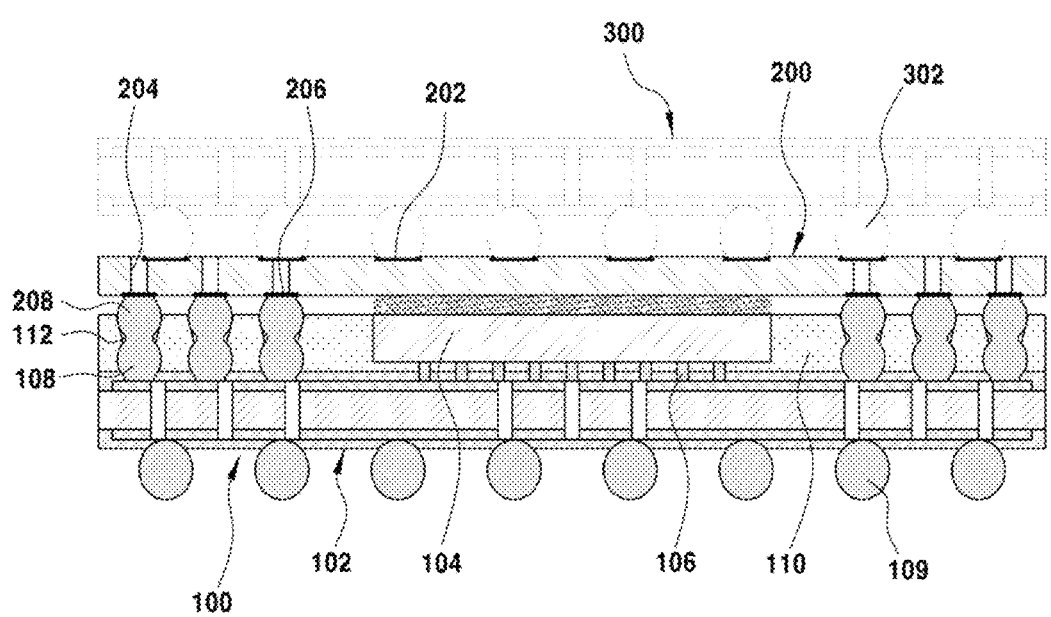
FIG. 5 shows a cross sectional view of a stacked semiconductor package, in accordance with various aspects of the present disclosure.

In FIG. 5, reference numeral 100 designates a lower semiconductor package, reference numeral 300 designates an upper semiconductor package, and reference numeral 200 designates an interposer, which conductively connects the lower semiconductor package 100 and the upper semiconductor package 300 to each other.

In an example implementation, to manufacture the lower semiconductor package 100, a strip substrate 102 (or panel of substrates), in which a plurality of semiconductor package-forming regions are formed at equidistant intervals in transverse (or lateral) and/or longitudinal directions thereof, is provided, and at least one semiconductor chip 104 (or die) is attached to a center region of each of the semiconductor package-forming regions of the strip substrate 102. The semiconductor chip 104 may be attached to the substrate 102 in any of a variety of manners. For example, the semiconductor chip 104 may be attached to the substrate 102 with conductive bumps 106 or any of a variety of conductive interconnection structures.

Stacking balls 108 may, for example, be fused on a conductive pattern formed at a peripheral region around the semiconductor chip 104, for example at an edge region of the substrate 102. The stacking balls 108 may, for example, be used for electrically connecting the substrate 102 to the interposer 200.

The upper surface of the substrate 102 may be molded or otherwise encapsulated with a molding compound resin 110 (or other encapsulating material), whereby the semiconductor chip 104 and the stacking balls 108 are sealed (e.g., in-whole or in-part) so as to be protected from the outside. The molding compound resin 110 may, for example, underfill the semiconductor chip 104 and/or a separate underfill material may underfill the semiconductor chip 104. For example, to enhance dissipation of heat generated by the semiconductor chip 104 to the outside, the upper surface of the molding compound resin 110 may be formed (e.g., originally formed, ground down, etc.) to be flush (or coplanar) with the upper surface of the semiconductor chip 104, so that the upper surface of the semiconductor chip 104 is exposed from the molding compound resin 110 to the outside.

Through-mold vias (TMVs) 112, for example having a predetermined depth, may be formed in the molding compound 110 to reveal the stacking balls 108. The TMVs 112 may be formed in any of a variety of manners, for example using laser processing (e.g., ablation) in the upper surface of the molding compound resin 110. For example, the through-mold vias 112 may be formed to the depth at which the stacking balls 108 are exposed from the molding compound resin 110.

The interposer 200 may, for example, be conductively stacked on the through-mold vias 112 of the lower semiconductor package 100.

The interposer 200 may comprise any of a variety of characteristics. For example, the interposer 200 may be formed of a printed circuit board (PCB), may be formed of a silicon material (e.g., in a back end of line wafer fab process, etc.), may be formed of layers of dielectric material and conductive material (e.g., in a post fab packaging process, etc.), etc. The interposer 200 may, for example, provide for electrical (or conductive) connection between the lower semiconductor package 100 and the upper semiconductor package 300. For example, the interposer 200 may comprise conductive pads 202 (or other interconnection structures or contacts) for connecting to the upper semiconductor package 300.

As illustrated in FIG. 5, the interposer 200 may be configured such that the conductive pads 202, which are connected to the input/output (IO) terminals 302 of the upper semiconductor package 300, are exposed from or on the upper surface thereof, and ball lands 206, which are connected to the conductive pads 202 by the via holes 204 and/or conductive traces (not shown), are formed on the lower surface thereof. Note that any of a variety of interconnection structures or contacts may be utilized.

Connection balls 208 may, for example, be fused (e.g., soldered, etc.) on the ball lands 206 of the interposer 200. The connection balls 208 may, for example, be stacked on the stacking balls 108 in the through-mold vias 112 of the lower semiconductor package 100 and may then be fused together, thereby achieving electrical connection and stacking of the interposer 200 on the lower semiconductor package 100.

The IO terminals 302 of the upper semiconductor package 300 may, for example, be fused (e.g., soldered, etc.) on the conductive pads 202 of the interposer 200, so that the upper semiconductor package 300 is stacked on the interposer 200.

Note that one or more semiconductor chips may be stacked on and attached to the conductive pads 202 of the interposer 200, in lieu of and/or in addition to stacking the upper semiconductor package 300 on the conductive pads 202.

Solder balls 109, which may for example be connected to the mother board of an electronic device, may be fused on the ball lands that are exposed at the lower surface of the substrate 102 of the lower semiconductor package 100, thereby forming a package-on-package structure configured such that the lower and the upper semiconductor package 100, 300 are stacked by means of the interposer 200.

In accordance with various aspects of this disclosure, a number of modifications may be made to the example package discussed above, non-limiting examples of which are provided herein.

First for example, in various implementations, an empty space may remain between the upper surface of the molding compound resin 110 of the lower semiconductor package 100 and the lower surface of the interposer 200. Such space may, for example, allow deterioration of the adhesion between the lower semiconductor package 100 and the interposer 200.

Secondly for example, a type of insulating adhesive, for example epoxy, may be applied on the upper surface of the semiconductor chip 104 before stacking the interposer 200. In an example scenario, the epoxy may be widely spread by pressure applied when the interposer 200 is stacked on the lower semiconductor package 100, which functions to adhere the semiconductor chip and the interposer to each other. However, because of the empty space between the upper surface of the molding compound resin 110, which may be formed to be flush with the semiconductor chip 104, and the lower surface of the interposer 200, the adhesion between the lower semiconductor package 100 and the interposer 200 may deteriorate.

Thirdly for example, when heat is generated in a reflow process for fusing (e.g., soldering, etc.) the connection balls 208 and the stacking balls 108 to each other when the lower semiconductor package 100 and the interposer 200 are stacked, there might be no additional member holding the lower semiconductor package 100 and the interposer 200 flat, and thus the edge portion of each of the lower semiconductor package 100 and the interposer 200 may warp due to the different respective coefficients of thermal expansion. Due to such warpage, a fault in which the connection balls 208 and the stacking balls 108 are detached from each other may occur.

Accordingly, various aspects of the present disclosure provide a stacked semiconductor package and/or method of manufacturing thereof that addresses the above concerns. For example, a stacked semiconductor package and a manufacturing method thereof are provided, for example wherein a lower semiconductor package and an interposer may be conductively connected and simultaneously adhered to each other using an adhesive member comprising (or containing) conductive particles, thereby facilitating the transmission of electrical signals between the lower semiconductor package and the interposer and increasing the size of a bond line between the lower semiconductor package and the interposer and the bondability therebetween.

For example, in an example implementation a stacked semiconductor package is provided that comprises: a lower semiconductor package, comprising a substrate, a semiconductor chip attached to a center of an upper surface of the substrate, IO terminals for stacking that are attached to an edge portion of the upper surface of the substrate, and a molding compound resin or other encapsulating material for over-molding the substrate so as to expose upper surfaces of the IO terminals for stacking while sealing at least a portion of the semiconductor chip and the IO terminals for stacking; and an interposer, conductively connected to the IO terminals of the lower semiconductor package and stacked on the lower semiconductor package, wherein an adhesive member comprising (or containing) conductive particles is provided between an upper surface of the lower semiconductor package and a lower surface of the interposer, so that the IO terminals of the lower semiconductor package and conductive pads of the interposer are conductively connected to each other by the conductive particles of the adhesive member and simultaneously the lower semiconductor package and the interposer are bonded to each other by adhesion of the adhesive member. For example, the non-conductive portions of the lower semiconductor package and the interposer may be bonded by the same adhesive member as utilize to bond the conductive portions of the lower semiconductor package and the interposer.

For example, the adhesive member, which may for example be attached to an entire lower surface of the interposer, is bonded to the upper surface of the lower semiconductor package upon stacking the interposer on the lower semiconductor package. Note that the adhesive member may be attached to either of the interposer and/or the lower semiconductor package (or neither) prior to the stacking.

The adhesive member may, for example, be provided as a film comprising (or containing) conductive particles and having a predetermined thickness. Alternatively, the adhesive member may be provided as a paste comprising (or containing) conductive particles. The adhesive member may, for example, comprise conductive particles of any of a variety of sizes and/or materials. For example, the conductive particles may comprise gold, graphite, insulator particles coated with conductive material, etc. The conductive particles may comprise any of a variety of sizes (e.g., 5 um, 4-6 um, 3-10 um, etc.). The conductive particles may, for example, represent a low percentage of the adhesive member, for example, 1-5% of the total content. The thickness of the adhesive member may comprise any of a variety of thicknesses (e.g., 15-25 um, 20-30 um, etc.).

The IO terminals for stacking may, for example, comprise conductive pillars or posts. For example, the IO terminals may comprise conductive posts or pillars (e.g., copper posts or pillars, etc.) spaced at a fine pitch (e.g., <130 um, <100 um, etc.).

In addition, another aspect of the present disclosure provides a method of manufacturing a stacked semiconductor package, comprising: conductively attaching a semiconductor chip to a center of an upper surface of a substrate; conductively attaching IO terminals for stacking to an edge (or peripheral) portion of the upper surface of the substrate; over-molding the substrate with a molding compound resin (or other encapsulating material) so as to seal the semiconductor chip and the IO terminals for stacking; uniformly grinding an upper surface of the molding compound resin so as to expose the IO terminals for stacking; attaching an adhesive member comprising conductive particles to a lower surface of an interposer; and stacking the interposer on a lower semiconductor package, so that the adhesive member attached to the interposer is conductively attached to an upper surface of the lower semiconductor package. Note that the adhesive member may also be attached to the lower semiconductor package prior to placement of the interposer.

For example, in attaching the IO terminals for stacking, a plurality of copper posts or pillars spaced at a fine pitch may be conductively attached to a conductive pattern formed at the edge portion of the upper surface of the substrate. Note, however, that the scope of this disclosure is not limited to such terminal arrangement.

In an example implementation, in stacking the interposer, the IO terminals of the lower semiconductor package and conductive pads of the interposer are conductively connected to each other by the conductive particles of the adhesive member and simultaneously the lower semiconductor package and the interposer are bonded to each other by adhesion of the adhesive member. For example, the same adhesive member may bond both conductive and non-conductive portions of the lower semiconductor package and the interposer to each other.

In stacking the interposer, both heat and pressure may, for example, be simultaneously applied to the adhesive member to bond the lower semiconductor package and the interposer to each other.

In addition, still another aspect of the present disclosure provides a stacked semiconductor package, comprising: a lower semiconductor package, comprising a substrate, a semiconductor chip attached to a center of an upper surface of the substrate, IO terminals for stacking that are attached to an edge portion of the upper surface of the substrate, and a molding compound resin (or other encapsulating material) for over-molding the substrate so as to expose upper surfaces of the IO terminals for stacking while sealing the semiconductor chip and the IO terminals for stacking; and an upper semiconductor package, conductively connected to the IO terminals of the lower semiconductor package and stacked on the lower semiconductor package, wherein an adhesive member comprising (or containing) conductive particles is provided between an upper surface of the lower semiconductor package and a lower surface of the upper semiconductor package, so that the IO terminals of the lower semiconductor package and ball lands of the upper semiconductor package are conductively connected to each other by the conductive particles of the adhesive member and simultaneously the lower semiconductor package and the upper semiconductor package are bonded to each other by adhesion of the adhesive member. For example, both conductive portions and non-conductive portions of the upper and lower semiconductor packages may be bonded to each other with the same adhesive member.

In addition, yet another aspect of the present disclosure provides a method of manufacturing a stacked semiconductor package, comprising: conductively attaching a semiconductor chip to a center of an upper surface of a substrate; conductively attaching IO terminals for stacking to an edge portion of the upper surface of the substrate; over-molding the substrate with a molding compound resin so as to seal the semiconductor chip and the IO terminals for stacking; uniformly grinding an upper surface of the molding compound resin so as to expose the IO terminals for stacking; attaching an adhesive member comprising (or containing) conductive particles to a lower surface of an upper semiconductor package; and stacking the upper semiconductor package on a lower semiconductor package, so that the adhesive member attached to the upper semiconductor package is conductively attached to an upper surface of the lower semiconductor package. Note that the adhesive member may also, for example, be attached to the upper surface of the lower semiconductor package prior to the stacking.

A stacked semiconductor package and/or manufacturing method thereof, in accordance with various aspects of the present disclosure, may provide any of a number of advantages.

First for example, a lower semiconductor package and an interposer may be conductively connected and simultaneously adhered to each other, using an adhesive member comprising conductive particles, thereby facilitating the transmission of electrical signals between the lower semiconductor package and the interposer by means of the conductive particles.

Secondly for example, the adhesive member comprising the conductive particles may be attached to the entire upper surface of the lower semiconductor package and the entire lower surface of the interposer, thus increasing the size of the bond line between the lower semiconductor package and the interposer and enhancing the bondability therebetween.

Thirdly for example, as the size of the bond line between the lower semiconductor package and the interposer is increased and the bondability therebetween is enhanced, the interposer and the lower semiconductor package can be held by the adhesive member, thus preventing the edge portions of the interposer and the lower semiconductor package from warping due to heat in the manufacturing process.

Fourth for example, when the adhesive member comprising the conductive particles is used, the IO terminals for stacking the interposer on the lower semiconductor package may be formed of a conductive (e.g., copper, etc.) post or pillar at a fine pitch (e.g., <130 um, <100 um, etc.).

Fifth for example, although a conventional package-on-package is manufactured through a plurality of processes, including attaching stacking balls on the lower semiconductor package, attaching connection balls on the interposer, forming through-mold vias in the molding compound resin by laser processing so as to expose the stacking balls, etc., in accordance with various aspects of this disclosure, grinding the molding compound resin to expose the conductive post and then conductively connecting the interposer on the conductive post by means of the adhesive member are efficiently carried out, thereby reducing the number of manufacturing processes.

Various aspects of the present disclosure are characterized in that the use of an adhesive member comprising (or containing) conductive particles facilitates the transmission of electrical signals between a lower semiconductor package and an interposer (e.g., without causing shorting between interconnection features) and also increases the size of a bond line between the lower semiconductor package and the interposer and the bondability therebetween.

For example, a package-on-package configured such that a lower semiconductor package and an interposer are stacked using an adhesive member comprising conductive particles is illustratively described herein, but the scope of this disclosure is not limited thereto. For example, various constituents (or components) that are conductively connected in a single package, including a substrate and a substrate, a substrate and a semiconductor chip, a semiconductor chip and a semiconductor chip, etc., may be conductively connected using the adhesive member comprising the conductive particles.

Figure 2:
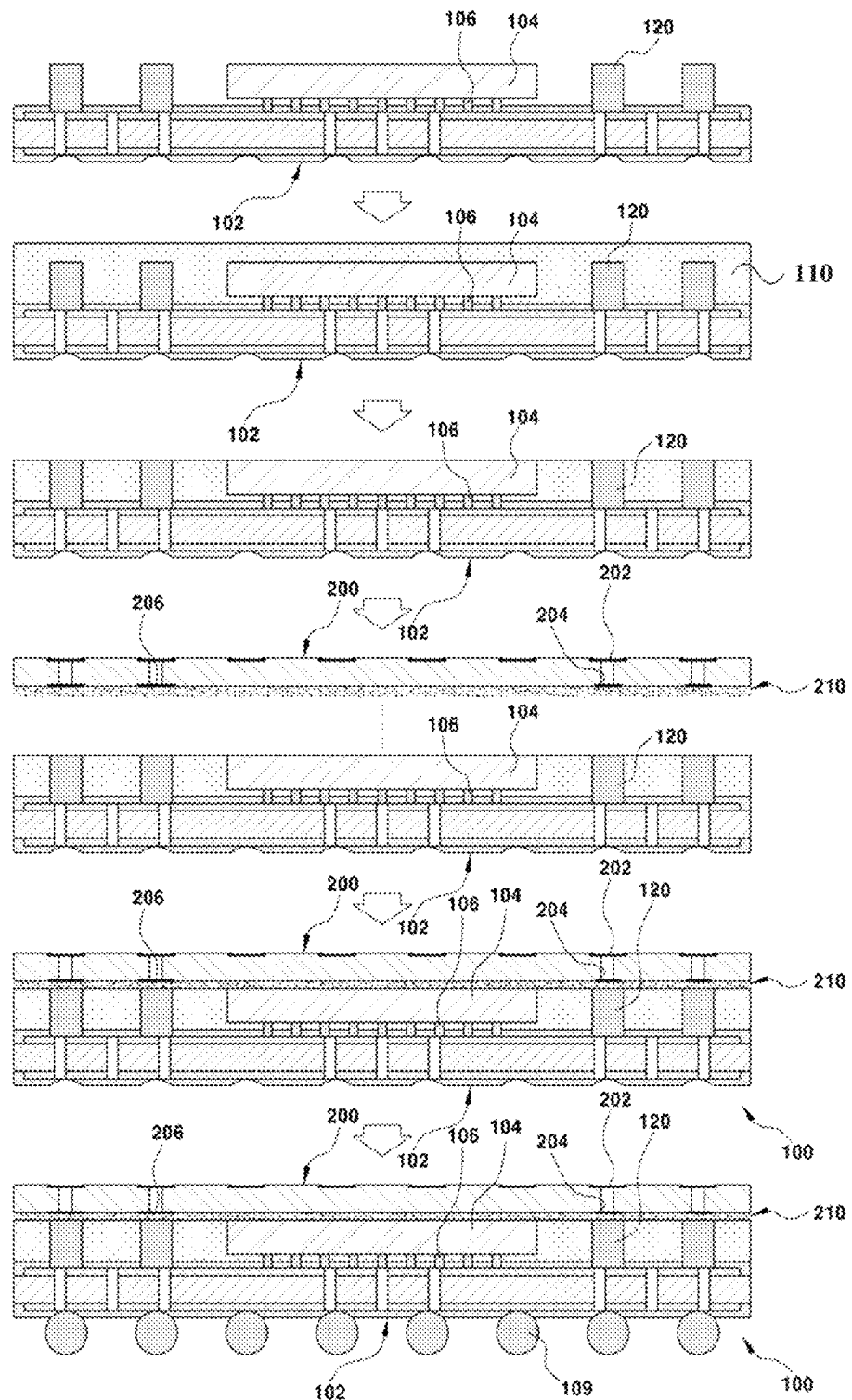
FIG. 2 shows cross-sectional views illustrating a method of manufacturing a stacked semiconductor package, in accordance with various aspects of the present disclosure.

FIG. 1 shows a cross-sectional view of a stacked semiconductor package, in accordance with various aspects of the present disclosure, and FIG. 2 shows cross-sectional views illustrating a method of manufacturing a stacked semiconductor package, in accordance with various aspects of the present disclosure.

In FIGS. 1 and 2, reference numeral 100 designates a lower semiconductor package, and reference numeral 200 designates an interposer, which conductively connects the lower semiconductor package 100 and an upper semiconductor package to each other.

In an example implementation, to manufacture the lower semiconductor package 100, a strip substrate 102 (e.g., a panel of substrates), in which a plurality of semiconductor package-forming regions may for example be formed at equidistant intervals in transverse and longitudinal directions thereof, is provided, and a semiconductor chip 104 is stacked on and attached to the center of each of the semiconductor package-forming regions of the strip substrate 102. The semiconductor chip 104 may, for example, be attached to the substrate 102 in any of a variety of manners and/or utilizing any of a variety of interconnection structures. For example, the semiconductor chip 104 may be attached to the substrate 102 with conductive bumps 106, for example to provide for the exchange of electrical signals.

IO terminals 120 (e.g., any of a variety of interconnection structures) for stacking may be fused (e.g., plated, soldered, etc.) on a conductive pattern formed at a peripheral region around the semiconductor chip 104, for example in the edge or peripheral region of the substrate 102. Note that the scope of this disclosure is not limited to such terminal arrangement. The IO terminals 120 for stacking may, for example, be used for the electrical connection to the interposer 200.

For example, the IO terminals 120 for stacking may comprise conductive posts (e.g., copper posts or pillars, etc.) with fine pitch spacing (e.g., <130 um, <100 um, etc.). The IO terminals 120 may, for example, be formed by plating, wire bonding, attaching preformed posts, etc. The conductive posts (or pillars) may, for example, comprise vertical sidewalls which allow closer spacing than is possible with conductive balls.

The upper surface of the substrate 102 may, for example, be encapsulated. In an example implementation, the upper surface of the substrate 102 may be molded with a molding compound resin 110 (or other encapsulating material), so that the semiconductor chip 104 and the IO terminals 120 for stacking are sealed (e.g., wholly or partially sealed) so as to be protected from the outside. For example, to enhance the dissipation of heat generated by the semiconductor chip 104 to the outside, the upper surface of the molding compound resin 110 may be adjusted to be flush with the upper surface of the semiconductor chip 104, so that the upper surface of the semiconductor chip 104 is exposed to the outside from the molding compound resin 110.

Subsequently, when the example interposer 200 is stacked on the lower semiconductor package 100, it is conductively connected to the IO terminals 120 for stacking to achieve the exchange of electrical signals. To this end, the upper surface of the molding compound resin 110 may for example be uniformly ground so that the upper surfaces of the IO terminals 120 for stacking are exposed to the outside of the molding compound resin 110. The top surface of the semiconductor chip 104 may, for example, also be exposed and/or ground at this time.

An adhesive member 210 comprising (or containing) conductive particles 212 is attached to the lower surface of the interposer 200. For example, the adhesive member 210 comprising the conductive particles 212 is stacked on and attached to the lower surface of the interposer 200 and the upper surface of the lower semiconductor package 100 so as to conductively connect the lower semiconductor package 100 and the interposer 200 to each other. Note that the adhesive member 210 may be coupled to the interposer 200 before being coupled to the lower semiconductor package 100, but this need not be the case.

The adhesive member 210 may, for example, be provided in the form of a polymer film comprising (or containing) conductive particles and having a predetermined thickness, or the adhesive member 210 is provided in the form of a polymer paste comprising (or containing) conductive particles. For example, the adhesive member 210 may comprise an anisotropic conductive film and/or paste. As discussed herein, the conductive particles may comprise any of a variety of characteristics. For example, the conductive particles may comprise gold balls, carbon balls, conductor-covered plastic balls, etc. Also for example, the conductive particles may comprise any of a variety of sizes (e.g., diameters or lengths of 5 um, 4-6 um, 3-10 um, etc.). Additionally for example, the conductive particle may be compressible. In an example implementation, the conductive particles may, for example, make up 1-5% of the film or paste, for example providing for insulation between adjacent interconnection features that are not to be electrically connected. Also as discussed herein, the thickness of the conductive paste may comprise any of a variety of thicknesses (e.g., 15-25 um, 20-30 um, etc.).

The adhesive member 210 may, for example, be attached to the entire lower surface of the interposer 200, and may then be adhered to the upper surface (e.g., the entire upper surfaces, etc.) of the lower semiconductor package 100 when the interposer 200 is stacked on the lower semiconductor package 100. Note that the adhesive member 210 may alternatively be adhered to the upper surface of the lower semiconductor package 100 before being adhered to the interposer.

In an example scenario, the interposer 200 having the adhesive member 210 attached thereto is stacked on and attached to the upper surface of the lower semiconductor package 100, thereby bonding the lower semiconductor package 100 and the interposer 200 to each other by the adhesion of the adhesive member 210 while also conductively connecting the IO terminals 120 of the lower semiconductor package 100 to the ball lands 206 of the interposer 200 by means of the conductive particles 212 of the adhesive member 210. As explained herein, the density of the conductive particles 212 in the adhesive member 210 may be sufficiently small so that many of such conductive particles may be trapped between interconnection structures (e.g., ball lands, IO terminals, etc.) to form a sufficient conductive path therebetween, but not provide a conductive pathway between adjacent interconnection structures that are not supposed to be electrically connected.

Figure 3:
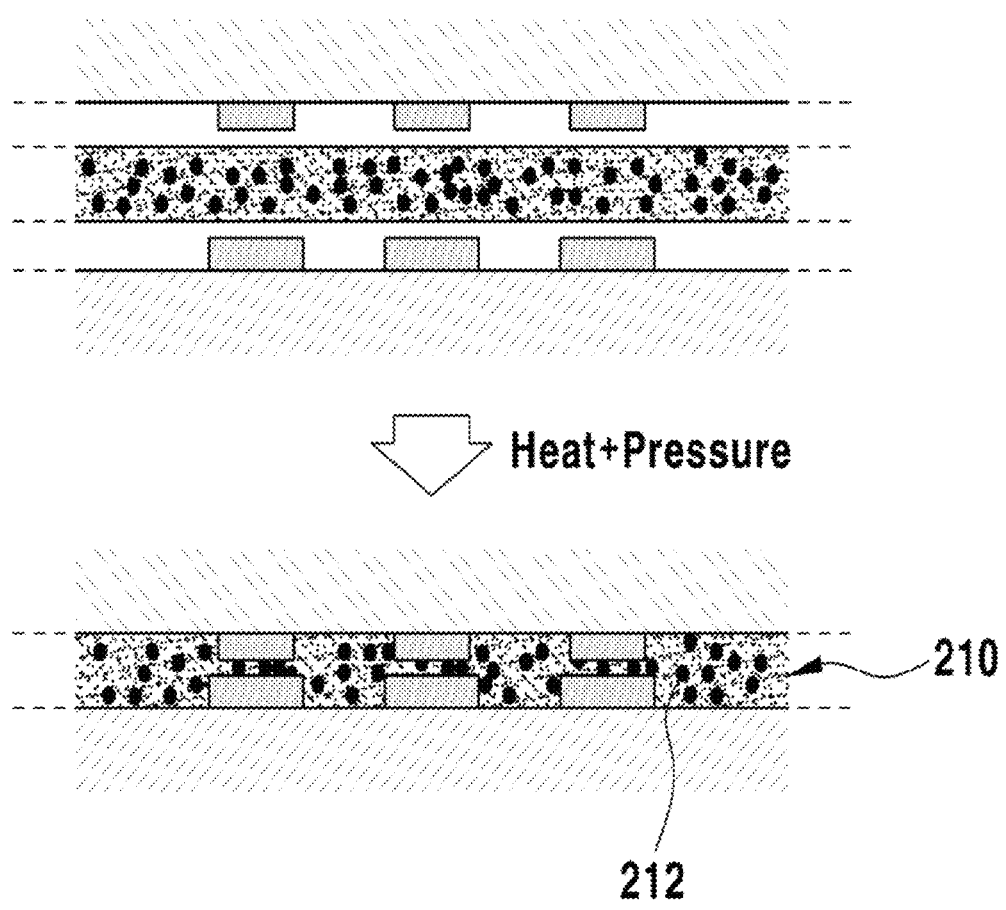
FIG. 3 shows a method for stacking an upper interposer and/or package on a lower package utilizing an adhesive member comprising conductive particles, in accordance with various aspects of the present disclosure.

Upon stacking the interposer 200 on the lower semiconductor package 100, the lower semiconductor package 100 and the interposer 200 are bonded to each other by the adhesion of the adhesive member 210, and furthermore, as illustrated in FIG. 3, the IO terminals 120 of the lower semiconductor package 100 are conductively connected to the ball lands 206 of the interposer 200 by means of the conductive particles 212 of the adhesive member 210, for example pressed between the terminals 120 and ball lands 206.

For example, when the interposer 200 is stacked, both heat and pressure may be simultaneously applied to the adhesive member 210 to bond the lower semiconductor package 100 and the interposer 200 to each other. For example, as the adhesive member 210 in film or paste form is melted by heat, the lower semiconductor package 100 and the interposer 200 are bonded to each other. Furthermore, as illustrated in FIG. 3, the conductive particles 212 of the adhesive member 210 will conductively connect the IO terminals 120 of the lower semiconductor package 100 to the ball lands 206 of the interposer 200 by the applied pressure.

In this way, the lower semiconductor package 100 and the interposer 200 may be conductively connected and simultaneously adhered to each other using the adhesive member 210 comprising the conductive particles 212, thereby facilitating the transmission of electrical signals between the lower semiconductor package 100 and the interposer 200 by virtue of the conductive particles 212. Moreover, as the adhesive member 210 may be attached to the entire upper surface of the lower semiconductor package 100 and to the entire lower surface of the interposer 200, the size of the bond line between the lower semiconductor package 100 and the interposer 200 may be increased and the bondability therebetween may be enhanced, thereby preventing the edge portions of the interposer and the lower semiconductor package from warping.

Figure 4:
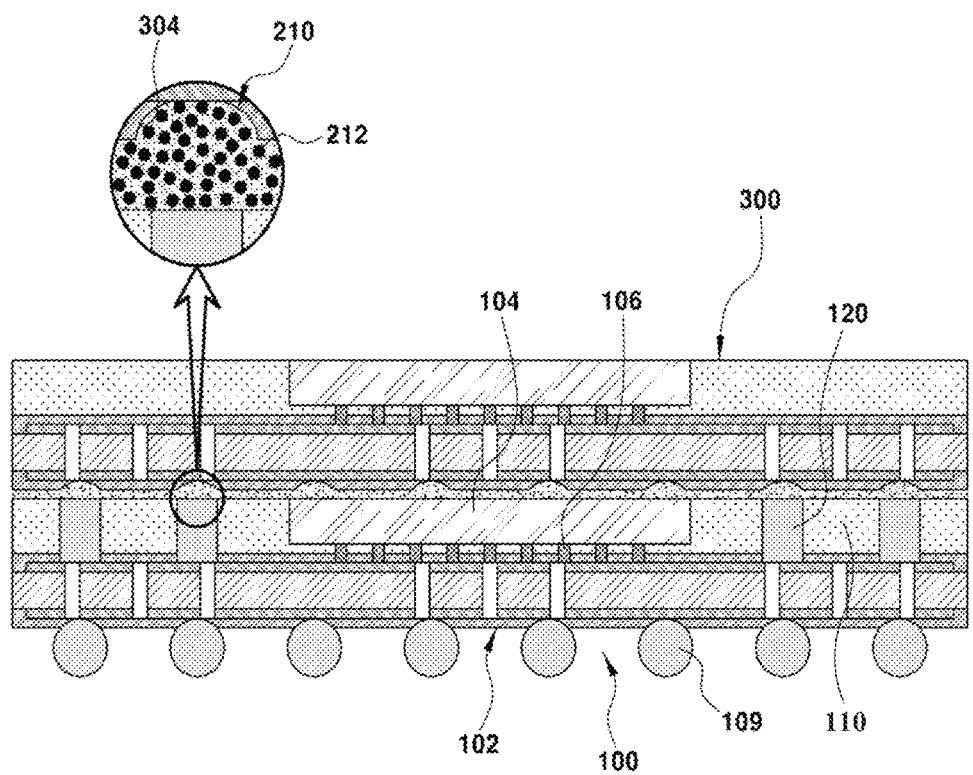
FIG. 4 shows a cross sectional view of a stacked semiconductor package, in accordance with various aspects of the present disclosure.

In another example implementation, as illustrated in FIG. 4, an upper semiconductor package 300 may be directly stacked on the lower semiconductor package 100 using the adhesive member 210 comprising the conductive particles 212, for example in lieu of stacking the upper semiconductor package thereon by means of the interposer. The example implementation of FIG. 4 may share any or all characteristics with any other implementation discussed herein (e.g., with regard to FIGS. 1-3, FIG. 5, the respective discussions thereof, etc.

The example implementation provides a lower semiconductor package 100 comprising a substrate 102; a semiconductor chip 104 attached to the center of the upper surface of the substrate 102; IO terminals 120 for stacking, attached to the edge portion of the upper surface of the substrate 102; and a molding compound resin 110 for over-molding the substrate 102 so that the upper surfaces of the IO terminals 120 for stacking are exposed while sealing the semiconductor chip 104 and the IO terminals 120 for stacking. Also, an adhesive member 210 comprising conductive particles 212 may be attached to the upper surface of the lower semiconductor package 100.

Subsequently, an upper semiconductor package (e.g., a ball grid array package having ball lands) is bonded to the upper surface of the adhesive member 210.

By the conductive particles 212 of the adhesive member 210, the IO terminals 120 (or other interconnection structure) of the lower semiconductor package 100 and the ball lands 304 (or other interconnection structure) of the upper semiconductor package 300 may be conductively connected to each other, and simultaneously, the lower semiconductor package 100 and the upper semiconductor package 300 may be bonded to each other by the adhesion of the adhesive member 210. Note that any of a variety of interconnection structures may be utilized (e.g., ball lands, pads, posts, etc.).

When the adhesive member comprising (or containing) the conductive particles is used in this way, the upper semiconductor package may be conductively connected to the lower semiconductor package and may simultaneously be bonded thereto, ultimately facilitating the transmission of electrical signals between the lower semiconductor package and the upper semiconductor package by the conductive particles. For example both conductive and non-conductive portions of the upper and lower semiconductor packages may be coupled with the same adhesive member.

In summary, various aspects of this disclosure provide a stacked semiconductor package and a method for manufacturing thereof. For example and without limitation, various aspects of this disclosure provide a semiconductor package in which an upper interposer and/or package are electrically and mechanically coupled to a lower package utilizing an adhesive member comprising conductive particles. While the foregoing has been described with reference to certain aspects and examples, it will be understood by those skilled in the art that various changes may be made and equivalents may be substituted without departing from the scope of the disclosure. In addition, many modifications may be made to adapt a particular situation or material to the teachings of the disclosure without departing from its scope. Therefore, it is intended that the disclosure not be limited to the particular example(s) disclosed, but that the disclosure will include all examples falling within the scope of the appended claims.

What is claimed is:

1. A stacked semiconductor package, comprising:
    a lower semiconductor package, comprising:
        a substrate;
        a semiconductor chip attached to a center region of an upper surface of the substrate;
        a plurality of terminals attached to and extending upward from a peripheral region of the upper surface of the substrate around the center region; and
        a molding compound covering the upper surface of the substrate, at least a portion of side surfaces of the semiconductor chip, and at least a portion of a side surface of each of the terminals,
        wherein at least an upper surface of each of the terminals is exposed from the molding compound; and
    an interposer comprising a plurality of contacts on a lower surface; and
    an adhesive member bonding the lower surface of the interposer to an upper surface of the lower semiconductor package, wherein the adhesive member comprises conductive particles that conductively couple each of the terminals of the lower semiconductor package and a respective one of the interposer contacts, and wherein the adhesive member directly contacts side surfaces of the interposer contacts.

2. The stacked semiconductor package of claim 1, wherein the adhesive member is attached to an entire lower surface of the interposer.

3. The stacked semiconductor package of claim 2, wherein the adhesive member is attached to an entire upper surface of the lower semiconductor package.

4. The stacked semiconductor package of claim 1, wherein the interposer comprises a substrate of an upper semiconductor package.

5. The stacked semiconductor package of claim 1, wherein the conductive particles of the adhesive member have a largest dimension that is less than one third of a thickness of the adhesive member.

6. The stacked semiconductor package of claim 1, wherein the adhesive member directly contacts a substrate of the interposer.

7. The stacked semiconductor package of claim 1, wherein between adjacent ones of the terminals, the adhesive member comprises conductive particles but does not electrically couple said adjacent ones of the terminals to each other.

8. The stacked semiconductor package of claim 1, wherein a top surface of the semiconductor chip is exposed from the molding compound, and the adhesive member bonds a lower surface of the interposer to the top surface of the semiconductor chip.

9. A stacked semiconductor package, comprising:
    a lower semiconductor package, comprising:
        a substrate;
        a semiconductor chip attached to a center region of an upper surface of the substrate;
        a plurality of terminals attached to and extending upward from a peripheral portion of the upper surface of the substrate around the center region; and
        a molding compound covering the upper surface of the substrate, at least a portion of side surfaces of the semiconductor chip, and at least a portion of a side surface of each of the terminals,
        wherein at least an upper surface of each of the terminals is exposed from the molding compound;
    an interposer comprising a plurality of contacts on a lower surface; and
    an adhesive member bonding the lower surface of the interposer to an upper surface of the lower semiconductor package, wherein the adhesive member comprises conductive particles that conductively couple each of the terminals of the lower semiconductor package and a respective one of the interposer contacts, wherein the adhesive member has a vertical thickness directly below the contacts of the interposer that is greater than a vertical thickness of the adhesive member directly below the interposer between the contacts of the interposer.

10. The stacked semiconductor package of claim 9, wherein the adhesive member is attached to an entire lower surface of the interposer.

11. The stacked semiconductor package of claim 10, wherein the adhesive member is attached to an entire upper surface of the lower semiconductor package.

12. The stacked semiconductor package of claim 9, wherein the interposer comprises a substrate of an upper semiconductor package.

13. The stacked semiconductor package of claim 9, wherein the conductive particles of the adhesive member have a largest dimension that is less than one third of a thickness of the adhesive member.

14. The stacked semiconductor package of claim 9, wherein the adhesive member directly contacts a substrate of the interposer.

15. The stacked semiconductor package of claim 9, wherein between adjacent ones of the terminals, the adhesive member comprises conductive particles but does not electrically couple said adjacent ones of the terminals to each other.

16. The stacked semiconductor package of claim 9, wherein a top surface of the semiconductor chip is exposed from the molding compound, and the adhesive member bonds a lower surface of the interposer to the top surface of the semiconductor chip.

17. A stacked semiconductor package, comprising:
a lower semiconductor package, comprising an interconnection structure exposed from an encapsulating material on an upper surface;
an interposer comprising an interconnection structure on a lower surface; and
an adhesive member bonding the lower surface of the interposer to an upper surface of the lower semiconductor package, wherein the adhesive member comprises conductive particles that conductively couple the interconnection structure of the lower semiconductor package and the interconnection structure of the interposer,
wherein the conductive particles of the adhesive member have a largest dimension that is less than one tenth of a pitch between the interposer interconnection structure and an adjacent interposer interconnection structure.

18. The stacked semiconductor package of claim 17, wherein the adhesive member is attached to the entire lower surface of the interposer.

19. The stacked semiconductor package of claim 17, wherein the adhesive member comprises an adhesive film comprising the conductive particles.

20. The stacked semiconductor package of claim 17, wherein between the interconnection structure of the lower semiconductor package and a second interconnection structure of the lower semiconductor package adjacent to the interconnection structure, the adhesive member comprises conductive particles but does not electrically couple said interconnection structure and said second interconnection structure.

* * * * *